(12) United States Patent
Schwarz et al.

(10) Patent No.: US 12,057,676 B2
(45) Date of Patent: Aug. 6, 2024

(54) METHOD FOR PRODUCING SEMICONDUCTOR LASERS AND SEMICONDUCTOR LASERS

(71) Applicant: OSRAM Opto Semiconductors GmbH, Regensburg (DE)

(72) Inventors: Thomas Schwarz, Regensburg (DE); Andreas Plößl, Regensburg (DE); Jörg Erich Sorg, Regensburg (DE); Frank Singer, Regenstauf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 748 days.

(21) Appl. No.: 17/294,816

(22) PCT Filed: Nov. 11, 2019

(86) PCT No.: PCT/EP2019/080861
§ 371 (c)(1),
(2) Date: May 18, 2021

(87) PCT Pub. No.: WO2020/104232
PCT Pub. Date: May 28, 2020

(65) Prior Publication Data
US 2021/0399518 A1 Dec. 23, 2021

(30) Foreign Application Priority Data

Nov. 21, 2018 (DE) .......................... 102018129343.7

(51) Int. Cl.
*H01S 5/02255* (2021.01)
*H01S 5/02* (2006.01)
(Continued)

(52) U.S. Cl.
CPC ........ *H01S 5/02208* (2013.01); *H01S 5/0201* (2013.01); *H01S 5/0213* (2013.01);
(Continued)

(58) Field of Classification Search
CPC .. H01S 5/02208; H01S 5/0201; H01S 5/0213; H01S 5/0217; H01S 5/02234; H01S 5/02255; H01S 5/028; H01S 5/4031
See application file for complete search history.

(56) References Cited

U.S. PATENT DOCUMENTS 6,331,382 B1 * 12/2001 Robertsson .............. G02B 6/26
430/945
2005/0062056 A1 * 3/2005 Baugh .................. G02B 6/4292
257/98
2013/0187179 A1 7/2013 Tan et al.

FOREIGN PATENT DOCUMENTS

DE 102004025428 A1 5/2005
DE 102014202220 B3 5/2015
(Continued)

OTHER PUBLICATIONS

Jitsuno et al., "UV laser ablative shaping of optical surface using ArF laser", Proceedings of SPIE, 2000, vol. 4088, pp. 224-227.
(Continued)

*Primary Examiner* — Yuanda Zhang
(74) *Attorney, Agent, or Firm* — MH2 Technology Law Group LLP

(57) ABSTRACT

In one embodiment, the method serves for producing semiconductor lasers and includes the following steps in the order indicated: A) applying a multiplicity of edge emitting laser diodes on a mounting substrate, B) applying an encapsulation element, such that the laser diodes are applied in each case in a cavity between the mounting substrate and the associated encapsulation element, C) operating the laser diodes and determining emission directions of the laser
(Continued)

diodes, D) producing material damage in partial regions of the encapsulation element, wherein the partial regions are uniquely assigned to the laser diodes, E) collectively removing material of the encapsulation element, said material being affected by the material damage, with the result that individual optical surfaces for beam shaping arise for the laser diodes in the partial regions, and F) singulating to form the semiconductor lasers.

17 Claims, 13 Drawing Sheets

(51) Int. Cl.
*H01S 5/02208* (2021.01)
*H01S 5/02234* (2021.01)
*H01S 5/028* (2006.01)
*H01S 5/40* (2006.01)

(52) U.S. Cl.
CPC ........ *H01S 5/0217* (2013.01); *H01S 5/02234* (2021.01); *H01S 5/02255* (2021.01); *H01S 5/028* (2013.01); *H01S 5/4031* (2013.01)

(56) References Cited

FOREIGN PATENT DOCUMENTS

| DE | 102014114618 A1 | 4/2016 |
|----|-----------------|--------|
| DE | 102016120635 A1 | 5/2018 |
| DE | 102018129346 A1 | 5/2020 |
| JP | 0758414 A | 3/1995 |

OTHER PUBLICATIONS

International Search Report (with English translation) and Written Opinion mailed on Feb. 11, 2020 for corresponding International Application No. PCT/EP2019/080861, 15 pages.

* cited by examiner

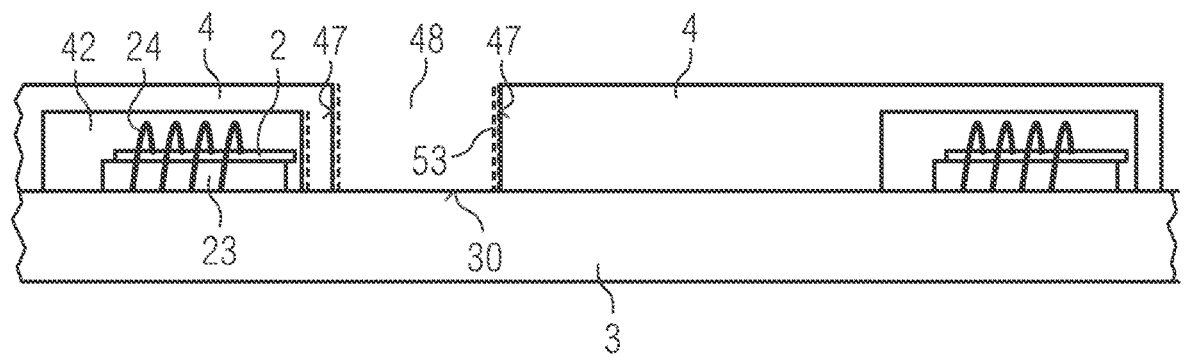
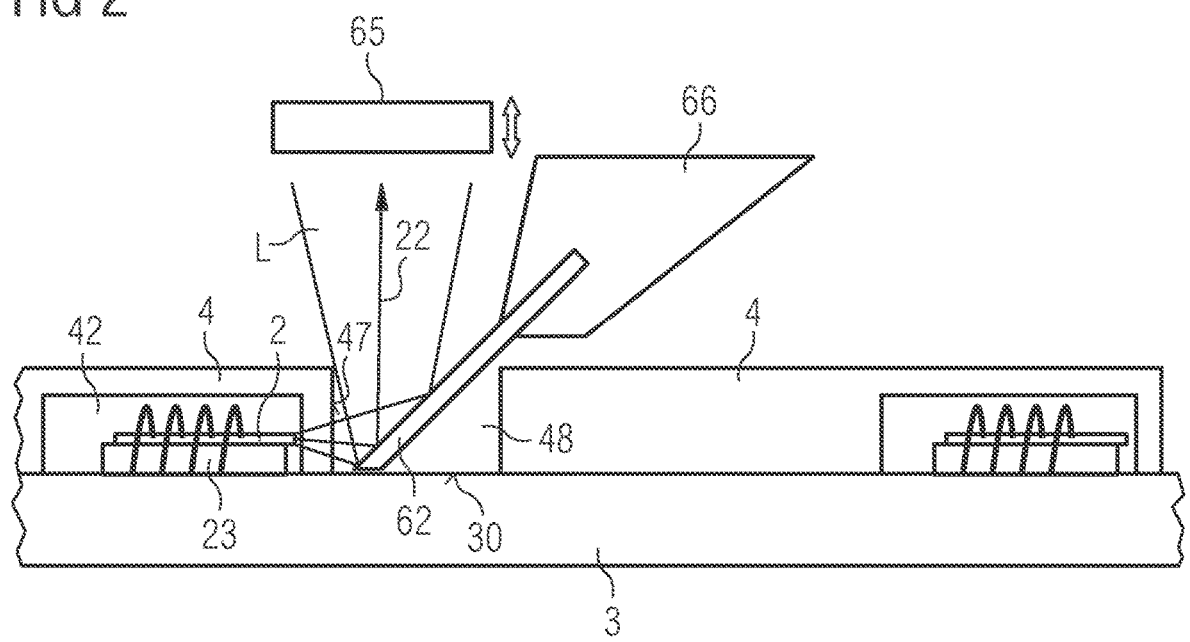

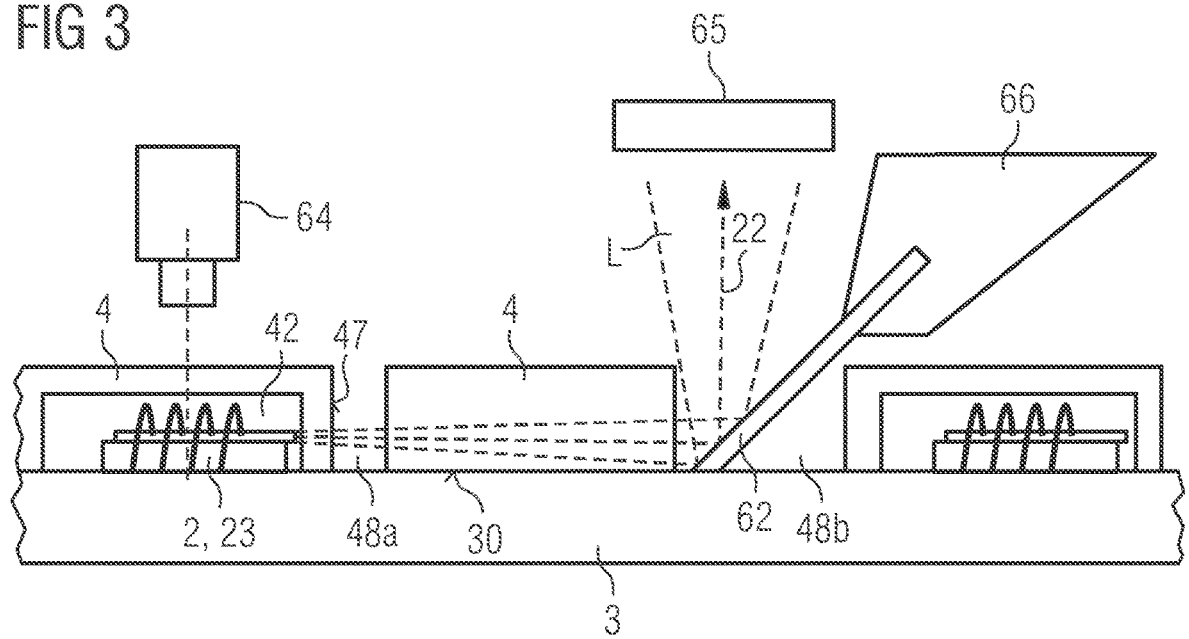
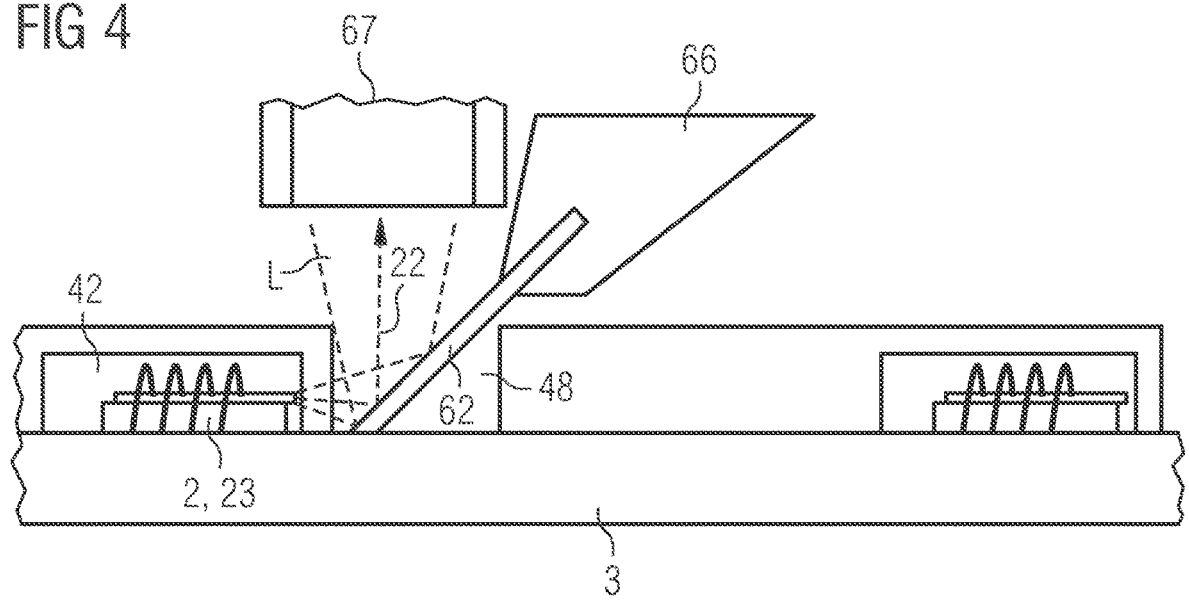

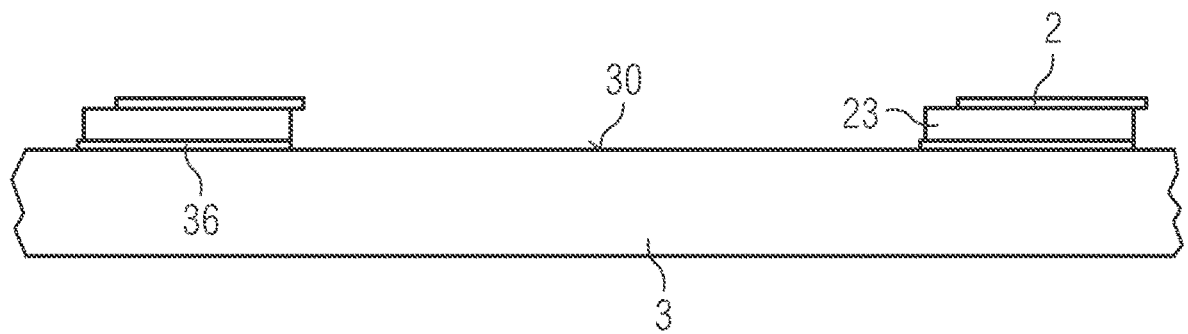
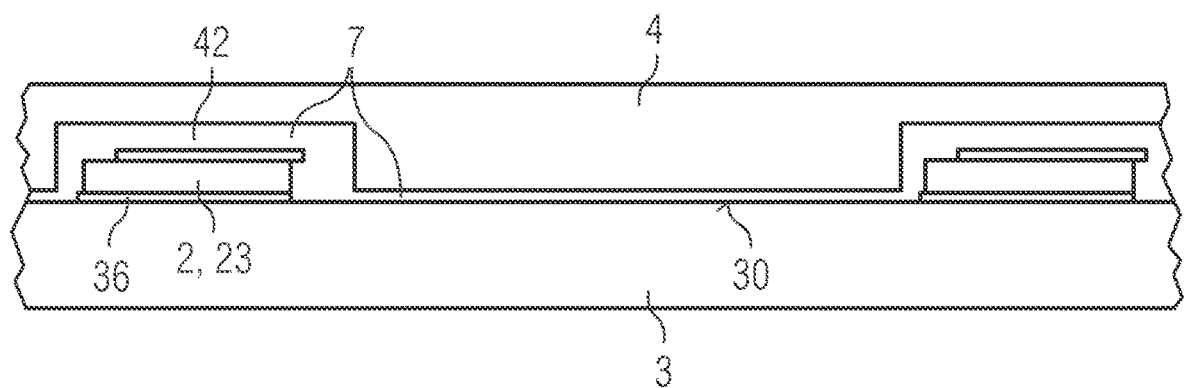
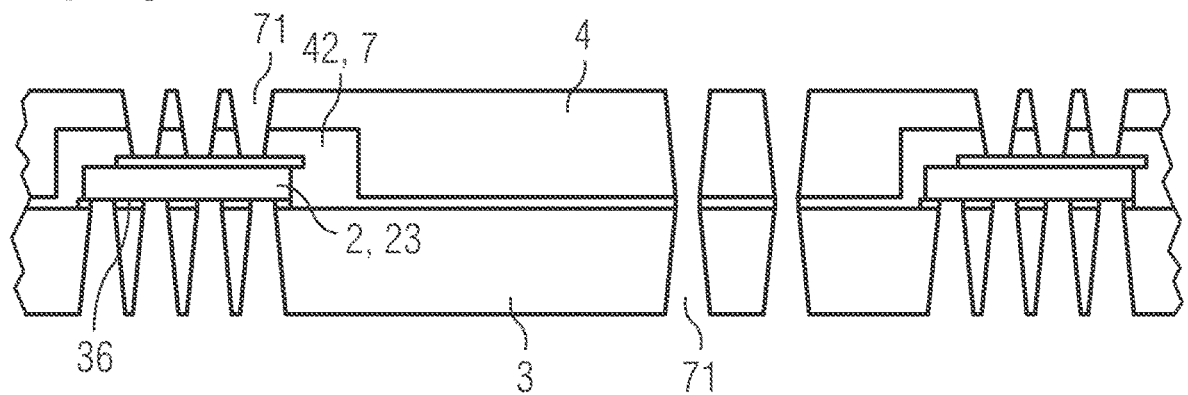

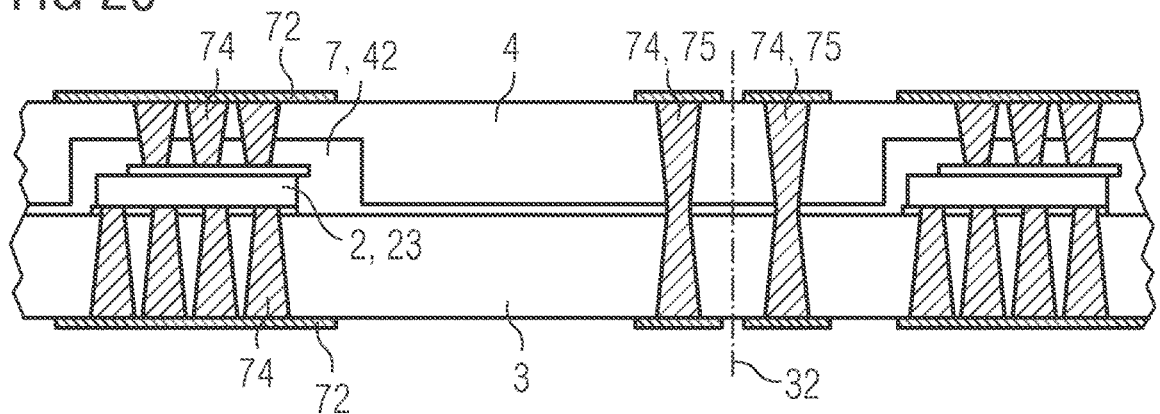
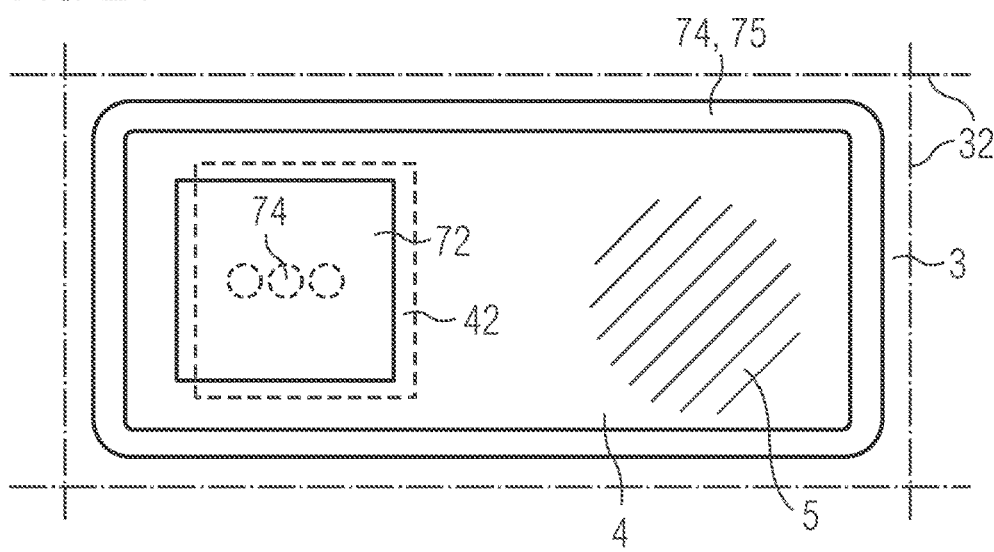
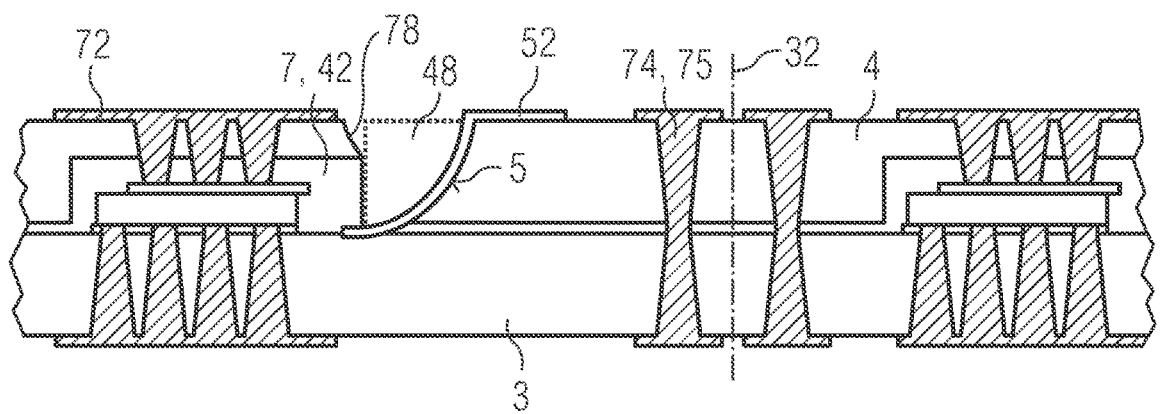

METHOD FOR PRODUCING SEMICONDUCTOR LASERS AND SEMICONDUCTOR LASERS

CROSS-REFERENCE TO RELATED APPLICATIONS

This patent application is a national stage entry from International Application No. PCT/EP2019/080861, filed on Nov. 11, 2019, published as International Publication No. WO 2020/104232 A1 on May 28, 2020, and claims priority under 35 U.S.C. § 119 from German patent application 10 2018 129 343.7, filed Nov. 21, 2018, the entire contents of all of which are incorporated by reference herein.

FIELD

A method for producing semiconductor lasers is specified. Furthermore, a semiconductor laser is specified.

BACKGROUND

A problem to be solved is to specify a method with which semiconductor lasers can be efficiently mounted on a mounting substrate in a wafer composite or panel composite.

This problem is solved inter alia by a method and by a semiconductor laser with the features of the independent patent claims. Preferred further developments are the subject of the dependent claims.

SUMMARY

In the method described herein, in particular, laser diodes are mounted in a disk composite or in a panel composite, wherein optical elements are subsequently brought in individually for the laser diodes in a housing, for example of glass, so that the optical elements suitably correct the laser radiation emitted by the laser diode in question and compensate for mounting tolerances.

According to at least one embodiment, the method comprises the step of mounting a plurality of laser diodes on a mounting substrate. The laser diodes are preferably edge-emitting laser diodes. The laser diodes are configured to generate a laser radiation and comprise at least one semiconductor material. For example, the laser diodes are based on the semiconductor materials AlInGaN, AlInGaAs or AlInGaP. In particular, the laser diodes are configured to generate visible radiation or near-ultraviolet radiation. For example, the laser diodes are blue light emitting components based on AlInGaN.

The mounting substrate is preferably provided as a wafer or a disk. Thus, the mounting of the laser diodes is done in a wafer assembly across the mounting substrate. The mounting substrate is preferably present in the finished semiconductor lasers and is the mechanically supporting and stabilizing component, i.e. a carrier, of the finished semiconductor lasers. The mounting substrate preferably has electrical structures such as electrical contact pads, vias and/or conductor tracks. In particular, the laser diodes are electrically contacted and connected via the mounting substrate. The mounting substrate is, for example, a ceramic substrate or a printed circuit board such as a metal core board. Furthermore, the mounting substrate may be made of a semiconductor material, such as silicon.

According to at least one embodiment, the method comprises the step of attaching at least one encapsulation element. A single encapsulation element may be used for all laser diodes, or groups of laser diodes may be covered by a common encapsulation element. Furthermore, individual encapsulation elements may be used for the laser diodes, wherein there may be a one-to-one correspondence between the encapsulation elements and the laser diodes.

The laser diodes are each located in a cavity between the mounting substrate and the associated encapsulation element. In this case, the mounting substrate is preferably planar in shape and recesses are formed in the encapsulation element to define the cavities. Alternatively, the mounting substrate may comprise corresponding recesses and the encapsulation element is planar in shape, or there may be recesses on both the mounting substrate and the encapsulation element to define the cavities through both components. Preferably, the laser diodes are encapsulated, in particular hermetically encapsulated, after the encapsulation element is attached.

According to at least one embodiment, the package comprising the encapsulation element and the mounting substrate is hermetically sealed and the laser diode is hermetically encapsulated within the package. That is, there is no significant exchange of substances such as oxygen or water vapor between an interior and an exterior of the housing. Hermetically sealed means, for example, that a leakage rate is at most $5 \times 10^{-9}$ Pa m/s, especially at room temperature.

According to at least one embodiment, the method comprises the step of operating the laser diodes and determining radiation directions of the laser diodes. Due to the fact that the at least one encapsulation element has been applied beforehand, the laser diodes can be operated at least for a short time without damage to the laser diodes resulting from environmental influences. Thus, the radiation directions of the laser diodes can be determined by operating the laser diodes. Determining the radiation directions may include measuring a position of the respective laser diode and/or characterizing an emission pattern at one or more locations along the radiation direction or along an emission direction. That is, the radiation direction can also be determined indirectly by measuring other quantities of the laser emission of the laser diodes. Particularly preferably, the associated radiation direction is determined individually for each laser diode.

According to at least one embodiment, the method comprises the step of generating material damages in partial areas of the at least one encapsulation element. The partial areas with the material damage are provided for subsequent material removal. The partial areas are uniquely, preferably in a one-to-one correspondence, assigned to the laser diodes.

According to at least one embodiment, the method comprises the step of collectively removing material of the at least one encapsulation element affected by the material damage. The removal of the pre-damaged material creates optical areas in the partial areas. The optical surfaces are individually associated with the laser diodes and serve for beam shaping and/or beam correction of the laser emission concerned. In particular, inaccuracies in a placement of the laser diodes on the mounting substrate are corrected by the optical surfaces individually assigned to the laser diodes.

According to at least one embodiment, the optical surface forms both a deflection optics and a focusing optics. Further focusing optics may then optionally be omitted.

According to at least one embodiment, the method comprises the step of singulating to the semiconductor lasers. The singulation is performed, for example, by means of sawing, laser cutting, scribing and breaking or also by means of etching. At least the mounting substrate is affected by the singulation. Optionally, the at least one encapsulation element is also cut during singulation.

In at least one embodiment, the method is for producing semiconductor lasers and includes the following steps, preferably in the order indicated:

A) attaching a plurality of edge-emitting laser diodes on a mounting substrate,

B) attaching at least one encapsulation element such that the laser diodes are each attached in a cavity between the mounting substrate and the associated encapsulation element, C) operating the laser diodes and individually determining radiation directions of the laser diodes, D) creating material damage in partial areas of the at least one encapsulation element, wherein the partial areas are uniquely assigned to the laser diodes, E) collectively removing material of the at least one encapsulation element, wherein this material is affected by the material damages, so that individual optical surfaces for beam shaping are created for the laser diodes in the partial areas, and F) singulating to the semiconductor lasers.

Semiconductor laser diodes preferably emit to the side, i.e., in the plane of the component or a semiconductor layer sequence, although the laser radiation is usually required upward, perpendicular to the plane of the semiconductor layer sequence. Therefore, when the semiconductor laser diodes are housed, a deflection optic is often suitably positioned to deflect the laser radiation. Semiconductor laser diode, deflection optics and focusing optics have to be precisely aligned to each other. This makes laser housings, beyond the sealing requirements, a complex product that defies usual mass production practice. If a semiconductor laser with side emission is desired, the deflection mirror for the laser diode is omitted for edge emitters, but the alignment requirements from laser emission to exit window remain.

With the method described here, it is achievable that the laser diodes can be positioned at wafer level or panel level with the relatively low accuracy from LED assembly, i.e. without active alignment when placing the laser diode or the possibly required deflection mirror, wherein surface mountable packages can be used. This is made possible in particular by the fabrication of individual optics after the laser diodes have been placed.

In contrast, the commonly used precise placement and alignment of laser diodes as well as optics at the house requires special precision machines. Often, the laser diode must be operated for this purpose. The machines for precision assembly are expensive and work slowly. Often comparatively old package designs such as TO packages are used, which can only be processed with through-hole mounting. The subsequent, individual mounting and generation of the optical surfaces in the method described here requires an additional work step, but the complex and expensive placement of the laser diodes with high precision is bypassed.

Thus, in the method described herein, the precision requirements for placing the laser diodes are reduced so that simpler and faster machines can be used and the processes can be performed more quickly and thus more cost-effectively. The location in the package where the laser diode is seated varies relatively widely across the mounting substrate, which has not yet been singulated. Furthermore, the package is provided with the optics, which are preferably at least partially subtractively fabricated and individualized, and whose shape or position can be adjusted from semiconductor laser to semiconductor laser. Thus, in an ensemble of semiconductor lasers, a comparatively wide distribution results with respect to the positions of the laser diodes and with respect to the design of the optical surfaces.

Optical measurements and laser exposures can be performed very quickly, so that serial processing can be performed economically for each component on a panel. The slow chemical processes, particularly in etching to create the optical surfaces, are preferably performed simultaneously for all devices.

According to at least one embodiment, the optical surfaces serve to deflect the radiation direction from parallel or approximately parallel to a mounting side of the mounting substrate to a direction perpendicular or approximately perpendicular to the mounting side. Approximately means in particular an angular tolerance of at most 10° or 5° or 2°. This means that a change in the radiation direction of approximately 90° can be achieved via the optical surface. In addition to a change of direction, a correction of a divergence of a laser emission of the associated laser diode is preferably also performed via the optical surface. The necessity of a divergence correction can result from variations in the distance of the laser diode to the optical surface.

According to at least one embodiment, the at least one encapsulation element is made of a material that is transmissive to the laser emission, preferably a transparent material. For example, the encapsulation element or elements are made of a glass, of quartz or of sapphire.

According to at least one embodiment, the encapsulation element associated with the laser diode in question completely covers the laser diode. The optical surfaces are each next to the associated laser diode when viewed from above on the mounting side. In particular, the optical surfaces and the associated laser diodes are arranged at a distance from one another, as seen in plan view.

According to at least one embodiment, the material damage in step D) is generated by means of a pulsed laser radiation. The material damages are generated, for example, by means of so-called stealth dicing, wherein a laser radiation is focused at specific locations within the material and the material damage results there due to high power densities of the laser radiation. The encapsulation element is preferably transparent to the laser radiation in step D). In particular, the material damage is not generated by absorption, but primarily due to the local, high power densities. A pulse duration of the laser radiation for generating the material damages is preferably at most 10 ns or 1 ns or 100 ps or 10 ps.

According to at least one embodiment, the collective removal in step E) is an etching, preferably a wet chemical etching. In particular, a wet chemical etching is enabled by protecting the laser diodes from an etching liquid by further components in step E).

According to at least one embodiment, the optical surfaces comprise at least one curvature. Thus, at least in places, the optical surfaces are not flat, planar surfaces. For example, the optical surfaces are of parabolic shape and may form curved 90° deflection surfaces.

According to at least one embodiment, the pulsed laser radiation for generating the material damage in step D) is irradiated through an opening in the mounting substrate through the mounting substrate into the material of the at least one encapsulation element. In this way, optical surfaces are achievable which achieve a deflection of the laser emission from a plane parallel to the mounting side out through the mounting substrate.

According to at least one embodiment, a mirror layer is applied to the optical surfaces in a step E1) between steps E) and F). This enables the optical surfaces to have a reflective effect. The mirror layer is a metal layer, such as an aluminum layer or a silver layer. Alternatively, the mirror layer can be implemented by a Bragg mirror with multiple pairs of layers.

According to at least one embodiment, the mirror layer is generated in a structured manner with the aid of a temporary mask layer. In this case, the mask layer can cover areas on which the mirror layer is not to remain later. Alternatively, after the mirror layer has been generated, the mask layer can cover areas that are to remain in the semiconductor laser, so that remaining areas of the mirror layer are removed, for example by etching.

According to at least one embodiment, the optical surfaces have a refractive effect. That is, the optical surfaces may be lenses.

According to at least one embodiment, the optical surfaces are generated in steps D) and E) on an outer surface of an outer wall of the associated cavity. This applies in particular if the optical surfaces only correct the radiation direction, but do not cause a major change in direction. That is, after passing through the optical surfaces, the laser emission in this case still runs, for example, parallel or approximately parallel to the mounting side.

According to at least one embodiment, at least in step C) there is a recess in the at least one encapsulation element on an outer surface of an outer wall of each of the cavities. This recess may be located indirectly or directly on the outer wall. It is possible that a further recess is located between this recess and the outer wall.

According to at least one embodiment, a test mirror is guided into the recess in step C) to determine the respective radiation direction. The test mirror is placed, for example, by means of a robot arm. The test mirror is only temporarily located in the respective recess and can be sequentially guided across the recesses at the different laser diodes.

According to at least one embodiment, the recess is located between the outer surface and the later, associated optical surface. Alternatively, it is possible that the later optical surface, which is generated only subsequently, is located between the recess and the associated outer surface.

According to at least one embodiment, the at least one encapsulation element comprises a plurality of reflection regions at least in step C). At the reflection regions, a deflection of the respective radiation direction from parallel to perpendicular to the mounting substrate or at least from approximately parallel to approximately perpendicular to the mounting substrate preferably takes place.

According to at least one embodiment, the reflection regions are formed by specularly reflecting outer boundary surfaces of the encapsulation element. Alternatively or additionally, the reflection regions are formed by diffusely reflecting scattering centers located within the at least one encapsulation element. Furthermore, it is possible that externally located diffusely reflecting structures or internally located specularly reflecting structures are used.

According to at least one embodiment, the determination of the respective radiation direction is performed in step C) by means of the reflection regions. With other words, the reflection regions represent an alternative to a test mirror.

According to at least one embodiment, the associated optical surfaces are generated in steps B) and E) respectively between the respective reflection region and the respective laser diode. That is, in the finished semiconductor lasers, the reflection regions are preferably without function.

According to at least one embodiment, in step C) a distance between the reflection regions and the respective associated laser diode is comparatively large. For example, this distance is at least 0.5 mm or 1 mm or 1.5 mm. Due to such a comparatively large distance, an increased precision in the determination of the radiation directions is achievable.

According to at least one embodiment, the reflection regions are removed in step F). Alternatively, the reflection regions may already be removed before step F) or may still be present in the finished semiconductor devices, so that the reflection regions are then not removed at all.

According to at least one embodiment, the laser diodes are each encapsulated with a potting material in a step A1) between steps A) and B). The potting is, for example, an epoxy resin or a silicone.

According to at least one embodiment, in step B) the cavities are partially or completely filled by the potting. In particular, the potting within the cavities extends completely along a light path of the laser emission of the laser diodes. The laser diodes are preferably completely enclosed and encapsulated by the respective associated potting, so that the laser diodes can be encapsulated in a liquid-proof manner due to the potting.

According to at least one embodiment, the potting is completely or partially removed before or after step F). Preferably, the potting is removed between steps E) and F).

According to at least one embodiment, in step B) the at least one encapsulation element is attached to the mounting substrate by means of the potting. The potting can thus serve as an adhesive between the encapsulation element and the mounting substrate. In particular, the potting extends areally between the mounting substrate and the at least one encapsulation element.

According to at least one embodiment, the potting is completely removed before step F), so that a gap is formed at least in places between the at least one encapsulation element and the mounting substrate. The gap may be gas-filled or evacuated. Such removal may also apply to an adhesive with which the laser diodes are attached to the mounting substrate, in particular temporarily attached.

According to at least one embodiment, one or more metallic vias extend through the at least one encapsulation element and at least to the mounting substrate. The at least one metallic via may extend completely through the mounting substrate. That is, the via may extend from a side of the mounting substrate facing away from the encapsulation element to a side of the encapsulation element facing away from the mounting substrate.

According to at least one embodiment, the metallic via completely and circumferentially surrounds the associated laser diode together with the optical surface when viewed from above on the mounting side. A metal frame is thus formed by this via, which effects a seal between the mounting substrate and the at least one encapsulation element. Furthermore, such a metal frame allows the encapsulation element to be held to the mounting substrate after the potting has been removed.

According to at least one embodiment, a continuous frame is formed by the at least one encapsulation element around the laser diodes and around the respective associated optical surface as seen in plan view on the mounting side. This frame preferably comprises a height which is greater than a maximum height of the optical surfaces. That is, the frame formed from the encapsulation element preferably projects all around the optical surfaces made from the encapsulation element.

According to at least one embodiment, exactly one encapsulation element is used. The encapsulation element extends continuously over all laser diodes until step F). Alternatively, individual encapsulation elements can be used for the laser diodes, which are not configured to be contiguous in any of the method steps.

According to at least one embodiment, the laser diodes are applied to the mounting substrate in a regular grid in step A) as intended. Thereby, a standard deviation between an actual position of the laser diodes to grid points of the grid across the mounting substrate is relatively large. With other words, the laser diodes are applied to the grid points of the mounting substrate comparably imprecisely.

For example, the standard deviation is at least 5 µm or 10 µm or 20 µm and/or at most 100 µm or 50 µm or 25 µm. In contrast, in conventional placement processes for laser diodes, which are carried out with a high degree of precision, the standard deviation is less than 5 µm or 2 µm. Thus, significantly larger placement tolerances are possible across the mounting substrate, and thus more cost-efficient attachment of the laser diodes.

In addition, a semiconductor laser is specified. The semiconductor laser is produced using a method as described in connection with one or more of the above embodiments. Features of the semiconductor laser are therefore also disclosed for the method, and vice versa.

In at least one embodiment, the semiconductor laser comprises the mounting substrate and one or more of the laser diodes mounted on the mounting substrate. Further, the semiconductor laser comprises the encapsulation element transmissive to a laser emission from the laser diode. The laser diode is attached in the cavity between the mounting substrate and the encapsulation element. The encapsulation element comprises one of the optical surfaces for beam shaping of the laser emission from the associated laser diode. The optical surface is configured for deflecting the laser emission from parallel to perpendicular to the mounting side of the mounting substrate. Between an outer wall of the cavity and the optical surface, there is a recess in the encapsulation element along the direction of emission of the laser emission. During operation of the semiconductor laser, the laser emission passes through both the outer wall of the cavity and the recess on the outer wall towards the optical surface.

BRIEF DESCRIPTION OF THE DRAWINGS

In the following, a method described herein and a semiconductor laser described herein are explained in more detail with reference to the drawing by means of exemplary embodiments. Identical reference signs thereby specify identical elements in the individual figures. However, no references to scale are shown; rather, individual elements may be shown exaggeratedly large for better understanding.

In the Figures:

FIGS. 1 to 6 show schematic sectional views of method steps of an exemplary embodiment of a method described herein, FIGS. 7, 9, 11 and 13 each show schematic sectional views of method steps of an exemplary embodiment of a method described herein, FIGS. 17 to 20 show schematic sectional views of method steps of a method described herein, FIG. 21 shows a schematic plan view of a method step of a method described herein, FIGS. 22 to 24 show schematic sectional views of method steps of a method described herein.

DETAILED DESCRIPTION

Figure 5:
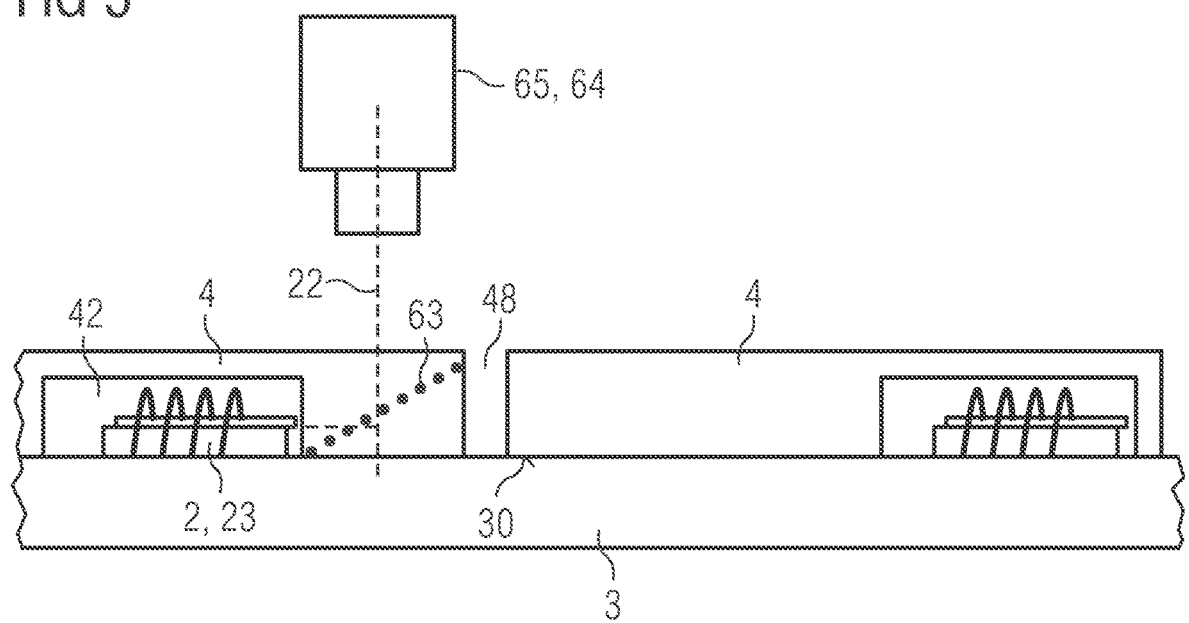

FIGS. 1 to 14 illustrate an exemplary embodiment of a method for producing semiconductor lasers 1. According to FIG. 1, a mounting substrate 3 is provided with, for example, a planar mounting side 30. The mounting substrate 3 preferably has electrical contact pads, via and/or conductor tracks which are not drawn. The mounting substrate 3 is, for example, a silicon carrier, a ceramic carrier or a printed circuit board such as a metal core board.

A plurality of edge-emitting laser diodes 2 are mounted on the mounting substrate 30, preferably in a two-dimensional regular arrangement. The laser diodes 2 may optionally each be mounted on a socket 23, also referred to as a submount. An electrical contacting of the laser diodes 2 takes place, for example, via bonding wires 24. An emission of laser radiation from the laser diodes 2 preferably takes place in the direction parallel or approximately parallel to the mounting side 30, in particular in an area in which the laser diodes 2 protrude laterally beyond the sockets 23.

An encapsulation of the laser diodes 2 takes place via encapsulation elements 4. The encapsulation elements 4 each comprise a cavity 42 in which the associated laser diode 2 is located. The cavity 42 is surrounded by outer walls with outer surfaces 47. Anti-reflective coatings 53 are present on the outer surfaces 47 and preferably also on inner surfaces of the cavities 42. Such anti-reflective coatings 53 may also be present in all other exemplary embodiments.

The encapsulation elements 4 are preferably soldered to the mounting substrate 3. Alternatively, a connection can be made via glass solders or glass frits or also via anodic bonding. Thus, the laser diodes 2 are hermetically sealed in the cavities 42 between the mounting substrate 3 and the encapsulation elements 4. The encapsulation elements 4 are, for example, made of a glass, of quartz or of sapphire.

According to FIG. 1, the laser diodes 2 are mounted on the mounting side 30 with comparatively large lateral tolerances. In order to subsequently compensate for the mounting tolerances, a determination of an emission direction 22 of the laser diodes 2 is carried out in the step of FIG. 2. The emission directions 22 are preferably determined individually and successively for the laser diodes 2. This can be done by bringing a test mirror 62 into a recess 48 of the encapsulation elements 4 or into a corresponding distance between two successive encapsulation elements 4, for example by means of an arm 66, which can be a robot arm.

Via the test mirror 62, a laser emission L, as generated by the laser diode 2 in question, is reflected in the direction towards a sensor 65. The sensor 65 is, for example, a CCD array. The sensor 65 is preferably moved in at least two positions in the direction perpendicular to the mounting side 30, so that the radiation direction 22 can be clearly determined via the beam profiles recorded at the various positions. Furthermore, it is possible that two fixed sensors, for example CCD fields, are used in combination with a beam splitter. The test mirror 62 may or may not touch down on the mounting side 30 when measuring the emission characteristics.

In FIG. 3, an alternative to the step of FIG. 2 is illustrated. The encapsulation element 4 comprises a plurality of recesses 48a, 48b. The recess 48a is located directly on the outer surface 47 through which the laser emission L is emitted. The recess 48b is located relatively far from the outer surface 47. Between the recesses 48a, 48b there is a block of the encapsulation element 4 in question through which the laser emission L is emitted and which is intended for the subsequent optical surface 5.

The test mirror 62 is placed in the more distant recess 48b in order to record the beam profile of the laser emission L via the sensor 65. In addition, a position of the associated laser diode 2 can be determined via a camera 64, whereby the beam direction 22 can be unambiguously determined.

In FIG. 4, as an alternative to FIG. 2 or 3, it is shown that scanning of the laser emission L is performed, for example, via an optical fiber 67. With the optical fiber 67, a spatial resolution within an emission zone of the laser emission L is preferably achievable.

In FIG. 5, as a further alternative, it is illustrated that a reflection region 63 is generated in the encapsulation element 4. The reflection region 63 may be formed by scattering centers generated, for example, via laser radiation. A scattering of the laser emission takes place at the reflection region 63, which may extend obliquely to the mounting side 30. The scattered laser emission can be detected via the camera 64 and/or via the sensor 65, whereby the radiation direction 22 can be determined.

Figure 6:
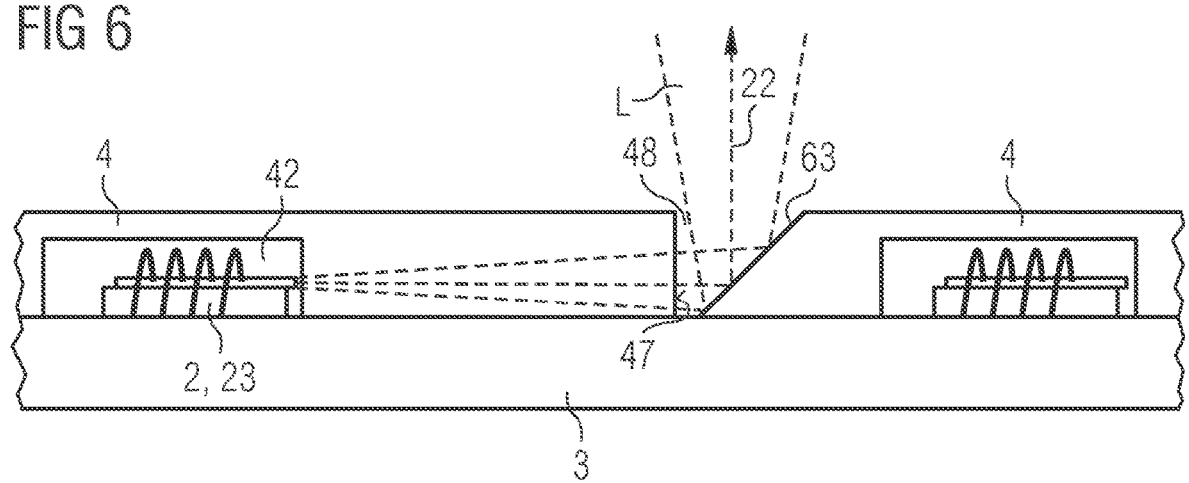

In the further alternative to FIGS. 2 to 5 of FIG. 6, a determination of the radiation direction 22 takes place by reflection of the laser emission L at the reflection region 63, which is formed by an oblique side surface of the encapsulation element 4 following it. The reflection region 63 preferably delimits the recess 48 at the outer surface 47.

Between the outer surface 47 and the laser diode 2, the encapsulation element 4 comprises a comparatively large thickness. The resulting large distance between the reflection region 63 and the laser diode 2 enables precise measurement of the radiation direction 22.

In the following figures, it is illustrated how an optical surface 5 for defined radiation of the laser emission L is generated. According to FIG. 7, material damage 45 is generated in each case by means of pulsed laser radiation 46 in a partial area 44 of the associated encapsulation element 4. This is done, for example, by means of so-called stealth dicing. A contour of the material damage 45 within the encapsulation element 4 is given by the preceding analysis of the radiation direction 22 and/or the radiation profile. Thus, an optical surface 5 is created in such a way that the desired radiation characteristic results, despite comparatively large mounting tolerances of the laser diodes 2 on the mounting substrate 3.

Optionally, partial areas of the encapsulation element 4 are covered by a mask layer 61. The mask layer 61 is, for example, a photoresist.

Figure 7:
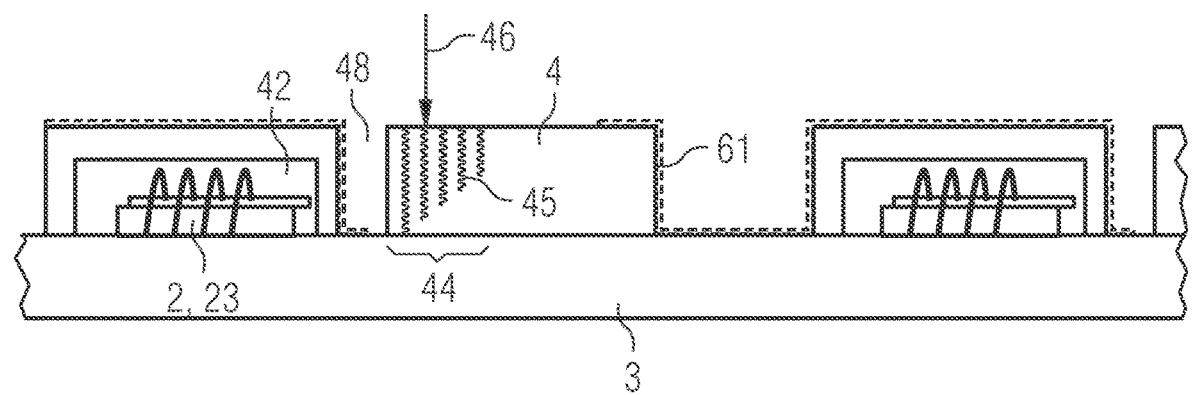
Figure 8:
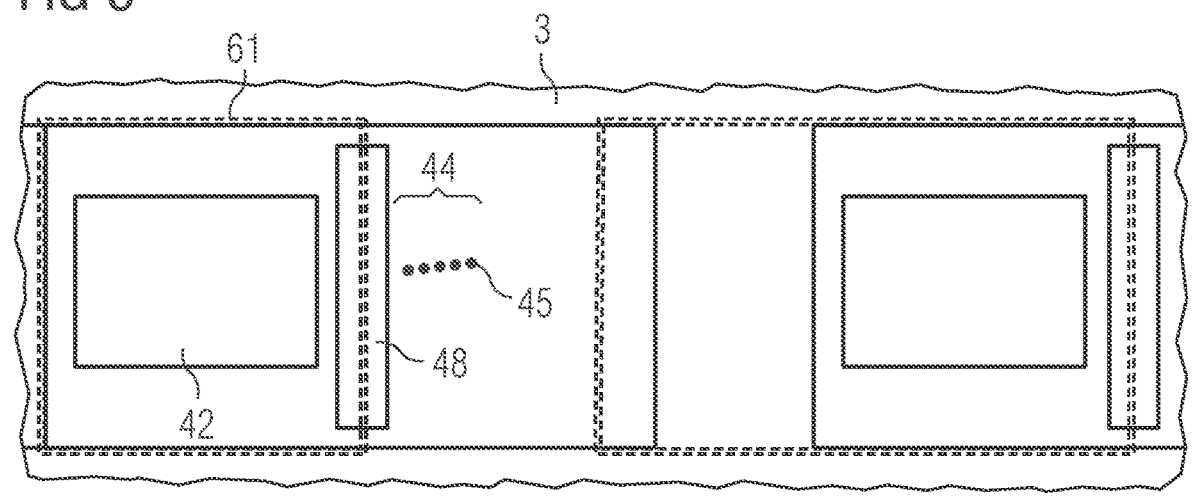
FIGS. 8, 10, 12 and 14 show schematic plan views of method steps of an exemplary embodiment of a method described herein.

FIG. 8 illustrates the plan view associated with the step in FIG. 7. The laser diodes 2 are not drawn here to simplify the illustration.

Figure 9:
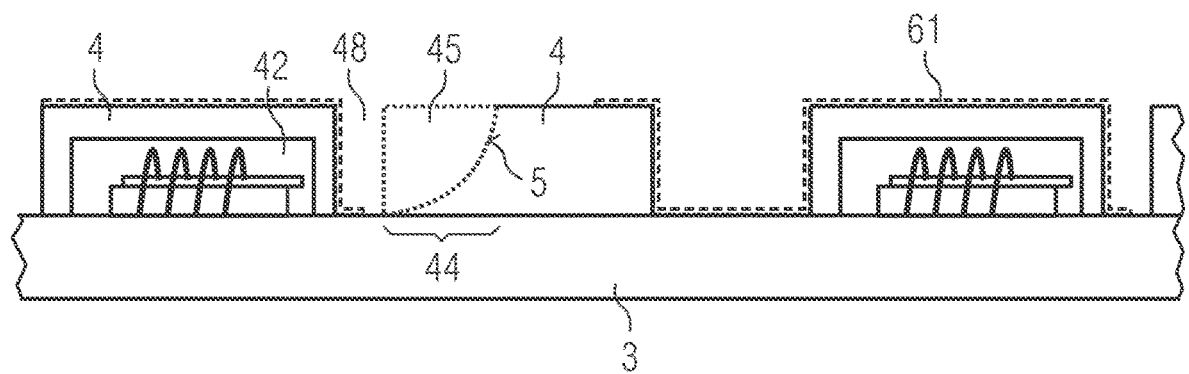
Figure 10:
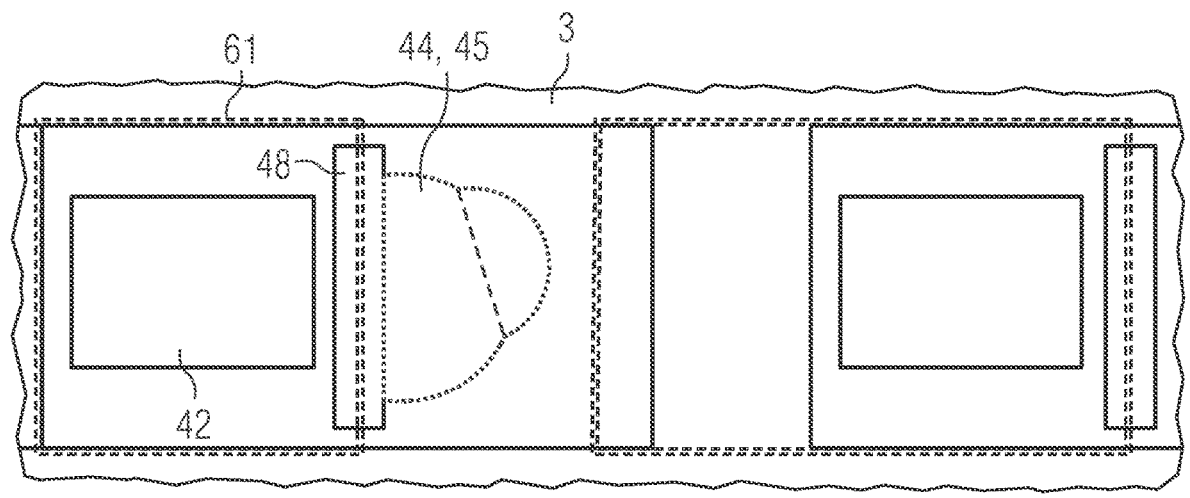

In the method step shown in FIGS. 9 and 10, the optical surface 5 is created. This is preferably done by wet chemical etching of the previously generated material damages 45.

The creation of the material damages 45 with the pulsed laser radiation 46 is done individually for each of the laser diodes 2. The etching to remove the damaged material and to ultimately form the optical surface 5 is preferably done for all laser diodes 2 in a common etching step.

FIG. 10 can optionally be followed by a method step not shown, in which the optical surface 5 is smoothed. This is done, for example, by local heating of the encapsulation element 4, for example by near-infrared laser radiation or by annealing in an oven. Furthermore, laser polishing is possible.

Figure 11:
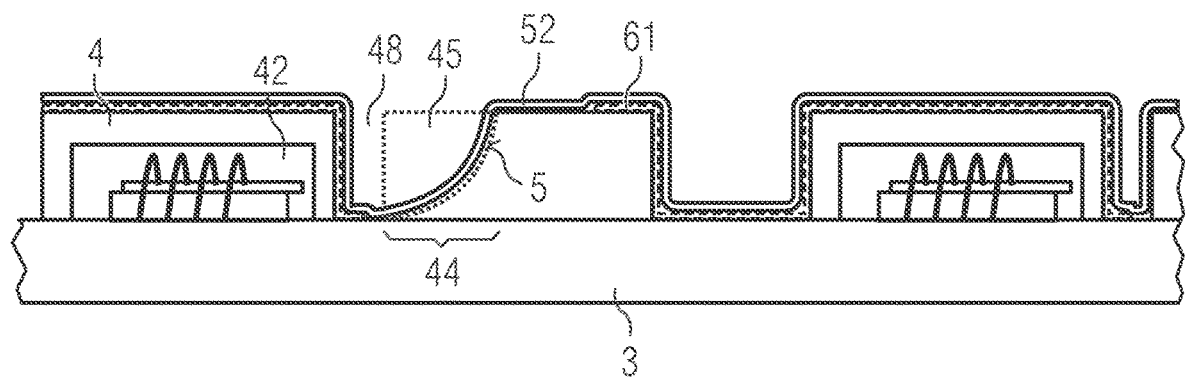
Figure 12:
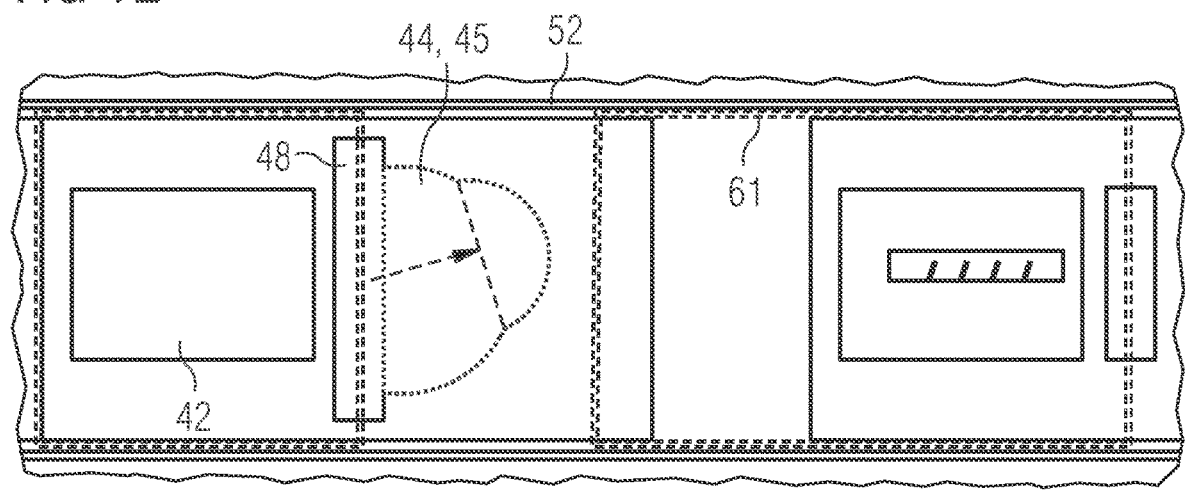

In the step of FIGS. 11 and 12, at least one mirror layer 52 is applied to the optical surface 5 of the encapsulation element 4. The mirror layer 52 is for example a metallic mirror, for example made of aluminum or silver. For this metallic mirror, an undrawn protective layer may be present. The mirror layer 52 may be applied over the entire surface.

Figure 13:
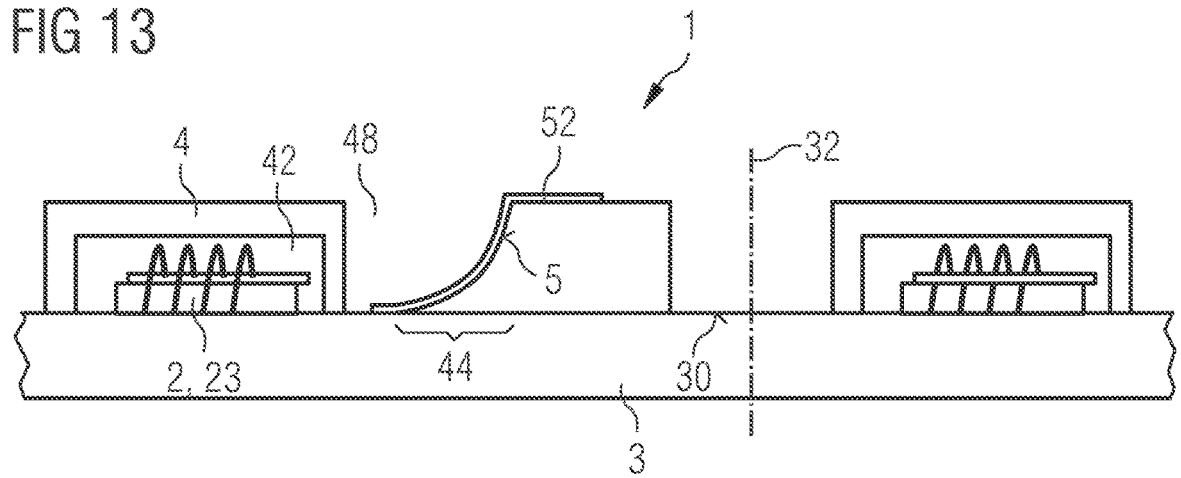
Figure 14:
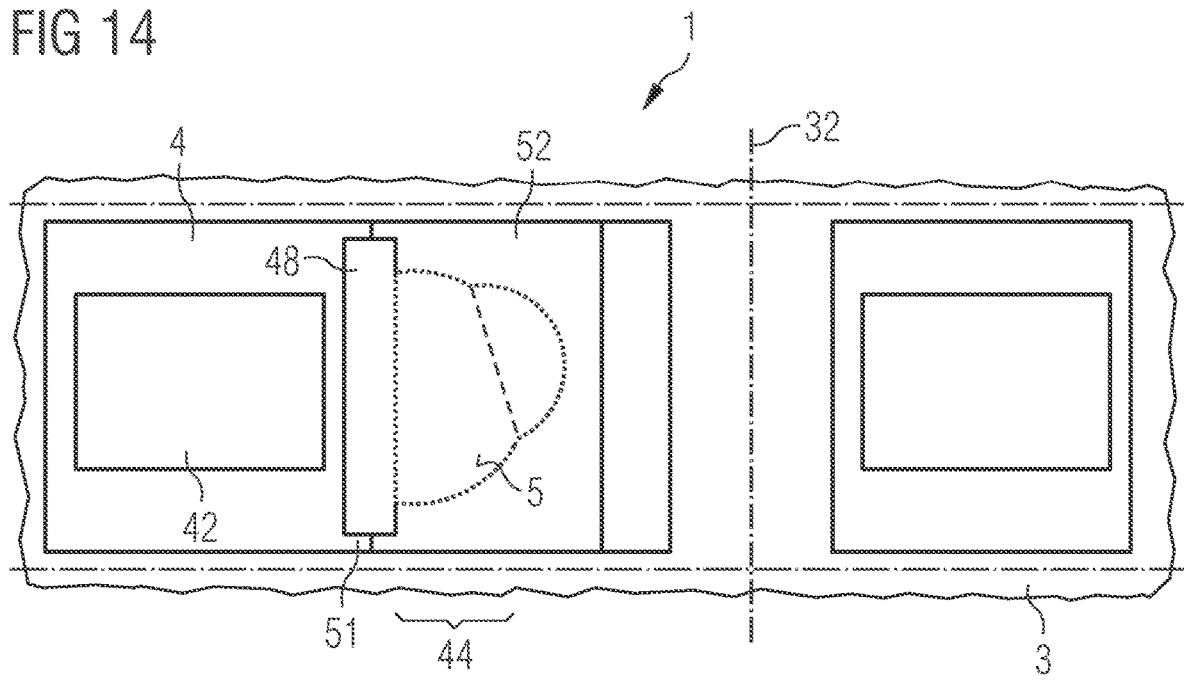

In the step of FIGS. 13 and 14, it can be seen that the mirror layer 52 is removed from all areas previously provided with the mask layer 61. This leaves the mirror layer 62 essentially only in the area of the optical surfaces 5.

In addition, it is shown in FIGS. 13 and 14 that singulation occurs along singulation lines 32. The singulation results in the semiconductor lasers 1. Singulation lanes may be present along the singulation lines 32, such that the singulation lines 32 may be free or substantially free of a material of the encapsulation elements 4.

From FIG. 14, it can be seen that the regions of the encapsulation elements 4 which comprise the cavities 42, as well as in which the optical surfaces 5 are shown, are surrounded by a continuous frame 51 of material of the encapsulation element 4 in question.

In order to reduce an etching effort, it is also possible that the encapsulation element 4 is already pre-structured in the region of the later optical surfaces, for example comprises an inclined surface or surfaces which correspond approximately to the later optical surface. This makes it possible to reduce the amount of etching required when forming the optical surfaces. Furthermore, it is possible to build the encapsulation element in several parts, for example in two parts. In this case, a lattice-like perforated center plate can be present, which is seated between the mounting substrate and a cover plate.

By means of a cutout in the mounting substrate or in an additional mounting plate, the etchant can be left in separation line cavities of the center plate for the etching step when producing the optical surfaces. An opening in the cover plate could also be used for this purpose. During the singulation step, the separation line cavities are divided so that a light exit window of a side emitter component can be formed by a cavity wall, compare also FIG. 25.

In the method described here, the optical surface is adapted to the actual position of the laser diode 2 after assembly, for example by means of Laser Induced Deep Etching, LIDE for short, or In-Volume Selective Laser Etching, ISLE for short. For this purpose, a laser beam 46 locally modifies the etchability of the encapsulation element 4 component by component so that the desired optical surface remains after removal of the modified areas. The etching to remove the irradiated areas is done collectively for all components of the mounting substrate.

Figure 15:
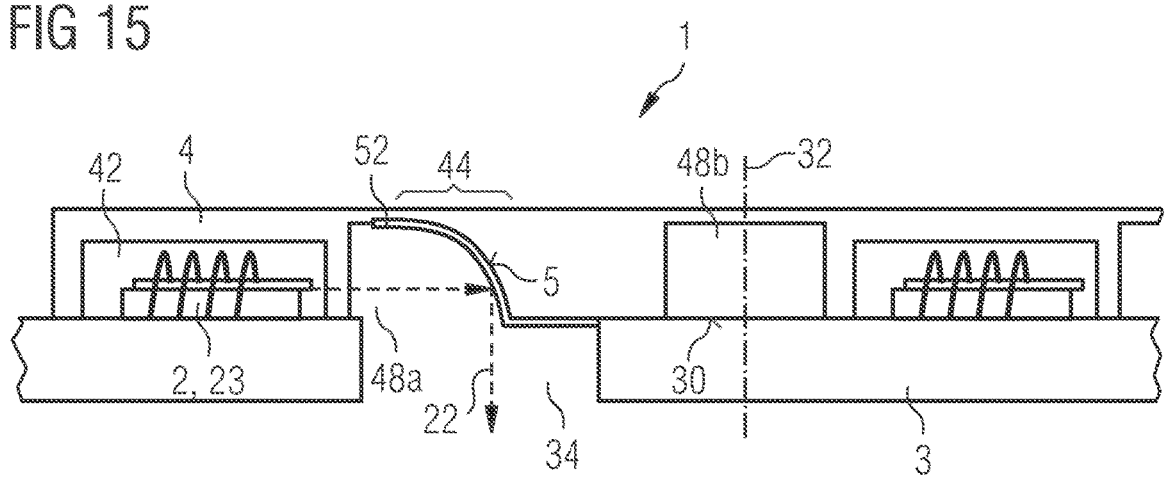
FIG. 15 shows a schematic sectional view of an exemplary embodiment of a method described herein.
Figure 16:
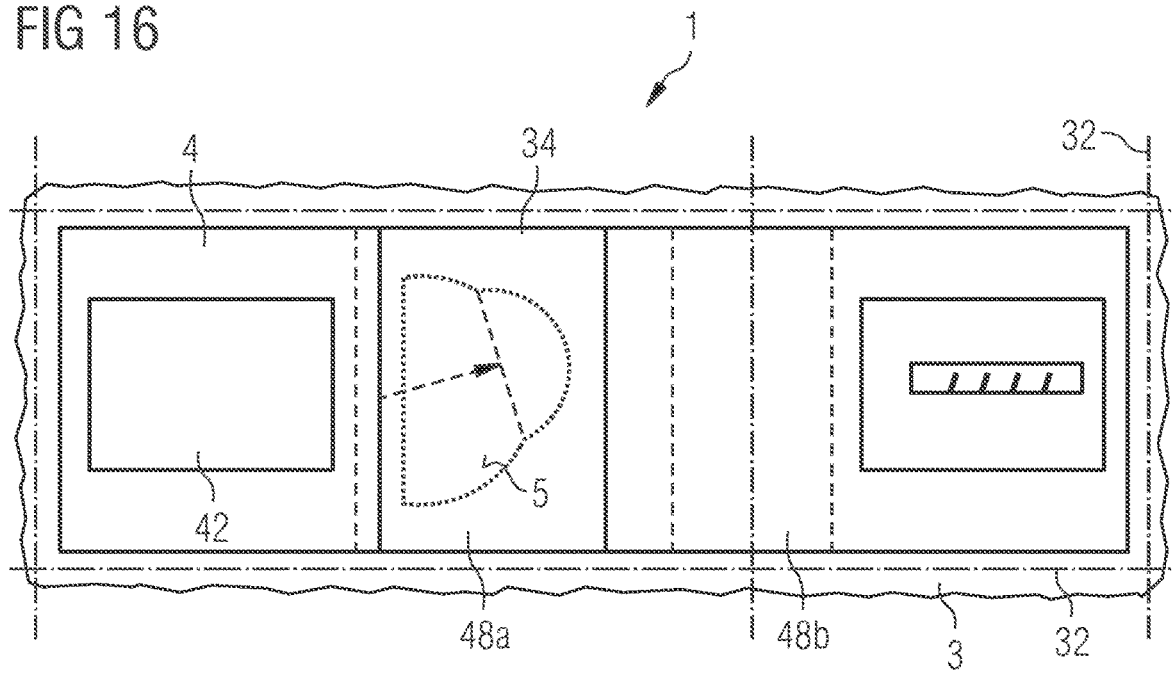
FIG. 16 shows a schematic plan view of a method step of an exemplary embodiment of a method described herein.

FIGS. 15 and 16 show a method step of a further exemplary embodiment of a method. FIGS. 15 and 16 correspond essentially to FIGS. 13 and 14. However, the optical surface 5 is processed through the mounting substrate 3. For this purpose, the mounting substrate 3 comprises an opening 34 in each area of the optical surface 5, which completely penetrates the mounting substrate 3. Thus, the partial area 44 with the material damages and with the finished optical surface 5 as well as preferably with the mirror layer 52 is accessible from a back side of the mounting substrate 3 facing away from the laser diodes 2.

The encapsulation element 4 can be of one-piece design and extend continuously over all laser diodes 2. For this purpose, further recesses 48*b* may be provided in the region of the singulation lines 32. It is possible that the recesses 48*b* are located on the mounting side 30 and are covered by the material of the encapsulation element 4. Thus, a continuous, flat surface can be formed on a side of the encapsulation element 4 facing away from the mounting substrate 3. In all other respects, the explanations of FIGS. 1 to 14 apply accordingly to FIGS. 15 and 16.

The reflection regions 63, in particular of FIG. 6, can be located at the singulation lines 32. Thus, the reflection regions 33 can be removed from the components with the singulation, so that the reflection regions 63 are no longer present in the finished semiconductor lasers 1. Referring to FIG. 5, it is possible that the reflection regions 63 are located above the later optical surface 5 and are thus removed by the creation of the optical surface 5.

In FIGS. 17 to 24, another exemplary embodiment of the production process is shown. According to FIG. 17, the laser diodes 2 together with the optional sockets 23 are attached to the mounting side 30 via an adhesive 36. The adhesive 36 is, for example, an epoxy adhesive.

In the step of FIG. 18, it is shown that a potting 7 is created. The preferably continuous encapsulation element 4 is pressed on in such a way that the cavities 42 are in particular completely filled by a material of the potting 7 and so that the encapsulation element 4 is bonded to the mounting substrate 3 via the potting 7.

The potting material 7 is preferably made of an epoxy or of a silicone. It is possible that a filler such as spheres of an oxide is added to the material for the potting 7. An upper side of the encapsulation element 4 facing away from the mounting substrate 3 is preferably flat, as is the mounting side 30.

FIG. 19 illustrates that several penetrations 71 are made through the mounting substrate 3 and the adhesive 36 on the one hand and through the encapsulation element 4 and the potting material 7 on the other hand. In the area of the laser diode 2, the penetrations 71 extend to the laser diode 2. In an area between adjacent laser diodes 2 on the mounting substrate 3, the penetrations 71 preferably extend completely through the arrangement.

It is possible that the penetrations 71 are generated by means of laser radiation. In this case, a specific laser radiation can be used per material to be processed. For example, the encapsulation element 4 is processed with a different laser radiation than the potting 7.

According to the step of FIG. 20, the penetrations 71 are filled so that electrical vias 74 and metal frames 75 are created. This metallization is carried out, for example, first by sputtering, whereby a thin metallic growth layer is formed, and subsequently by electroplating based on the growth layer. The metallic structures 72, 74, 75 are made of copper, for example.

Via the vias 74 in the area of the laser diode 2, an electrical connection of the laser diode 2 is made possible. For this purpose, contact pads 72 can also be generated from one or more metals. The contact pads 72 can be solderable layers.

In FIG. 21 it is further illustrated that the metal frames 75, which extend completely through the arrangement, are guided as a closed frame preferably close to the singulation lines 32 completely around the associated cavity 42 and around an area for the later optical surface 5. In FIG. 21, the area with the later optical surface 5 is indicated by a hatching.

Above the metal frame 75, a tight connection of the encapsulation element 4 with the mounting substrate 3 and a hermetic seal is achievable, even after a singulation process along the singulation lines 32.

Preferably subsequently, a determination of the radiation directions is carried out, not specifically illustrated in the method of FIGS. 17 to 24. For this purpose, structures are preferably present or measurements are carried out, as illustrated in connection with FIGS. 2 to 6. Corresponding structuring is not illustrated in the method of FIGS. 17 to 24 to simplify the representation.

Thereupon, preferably analogously to FIGS. 7 to 14, the optical surfaces 5 are collectively formed with the optional mirror layer 52. The collective etching for generating the mirror surfaces 5 thereby preferably leaves a material of the potting 7 unimpressed, so that the potting 7 is not or not significantly affected by the etching and remains standing. Edge rounding may occur above the area with the potting 7, resulting from the etching of the encapsulation element 4.

Figure 23:
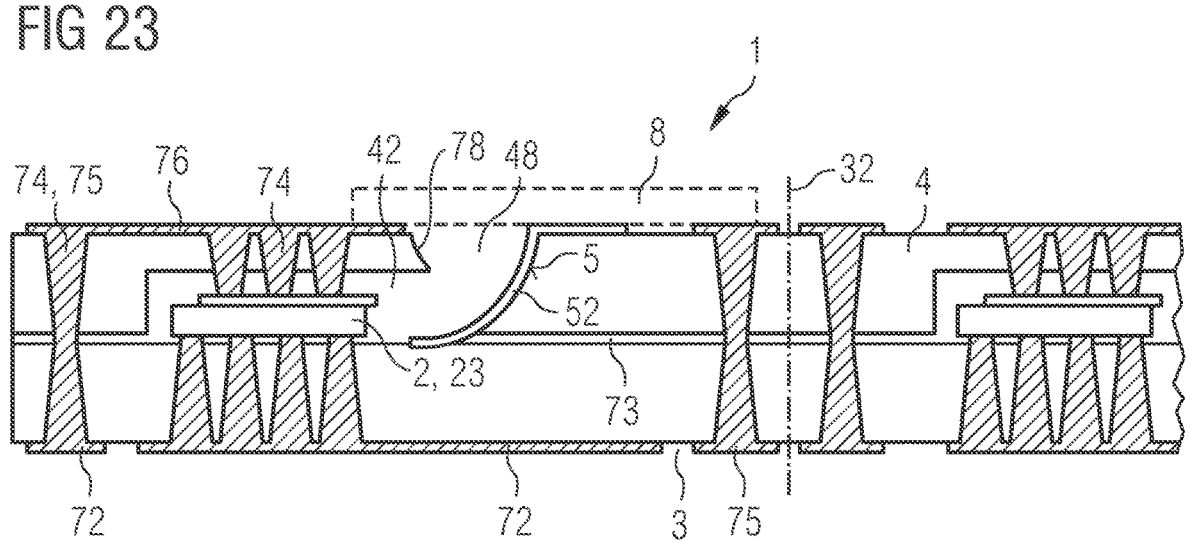

In FIG. 23 it is shown that optionally the potting 7 and also the adhesive 36 can be completely removed via a further etching process. This can result in a gap 73 between the mounting substrate 3 and the encapsulation element 4 as well as between the laser diode 2 and the mounting substrate 3. However, since a seal is provided via the metallic frame 75, hermetic encapsulation of the laser diode 2 is still possible.

Preferably, a cover 8, for example made of a glass plate, is also applied. Deviating from the illustration of FIG. 23, the cover 8 can also be lens-shaped, but is preferably a plane-parallel plate. The cover 8 is soldered, for example, to the metal frame 75 and/or to conductor tracks 76.

Furthermore, it is illustrated in FIG. 23 that all electrical contact pads 72 for external electrical contact can be attached to a single side of the mounting substrate 3. Via electrical conductor tracks 76, which are led through the encapsulation element 4 in the area of the laser diode 2 between the frame 75 and the vias 74, this can be realized.

Figure 24:
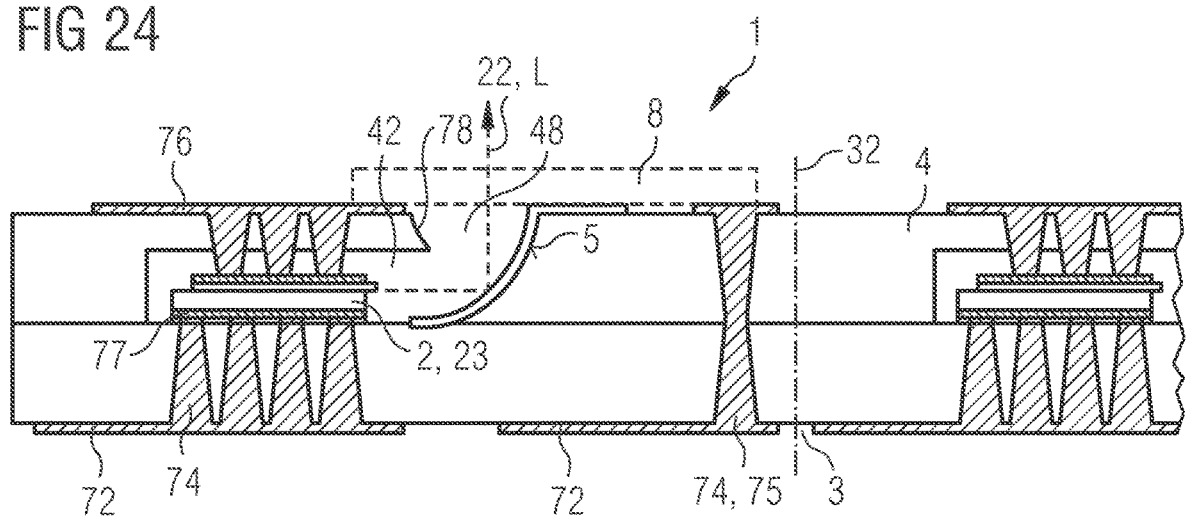

FIG. 24 corresponds substantially to FIG. 23, wherein, however, the gap is omitted. For example, the mounting substrate 3 and the encapsulation element 4 are directly connected to each other via anodic bonding. The laser diode 2 with the socket 23 may be soldered to the mounting substrate 3 by means of a solder 77.

Figure 25:
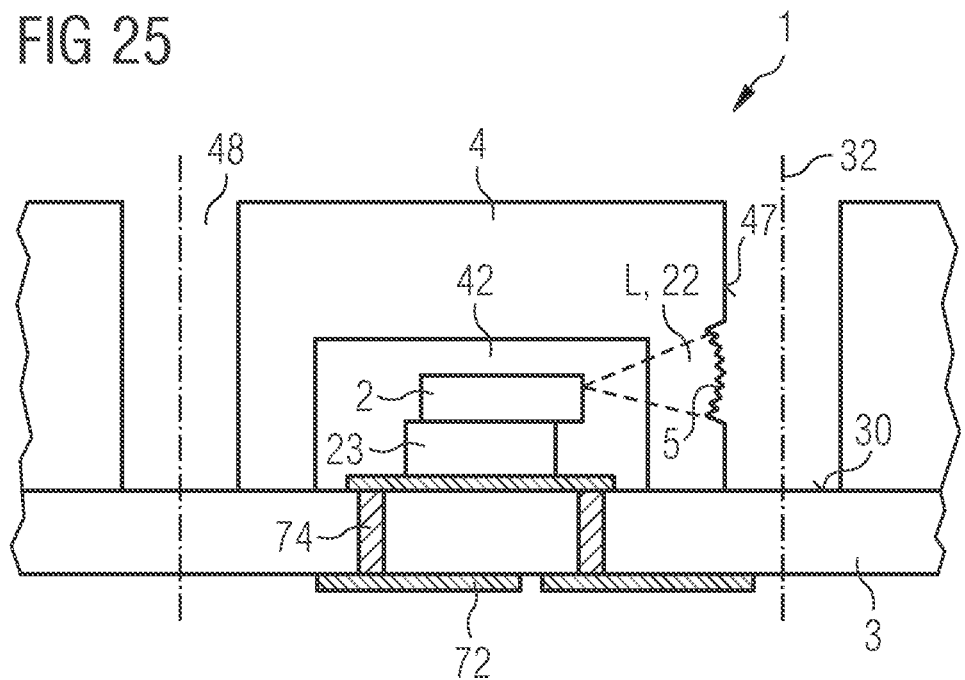
FIGS. 25 and 26 show schematic sectional views of exemplary embodiments of semiconductor lasers described herein.

In the exemplary embodiment of the semiconductor laser 2, as shown not singulated yet in FIG. 25, there is no deflection of the beam direction 22 of the laser emission L. Thus, the optical surface 5 can be located directly on the outer surface 47 of the cavity 42. In the case of the semiconductor laser of FIG. 1, emission thus takes place essentially in the direction parallel to the mounting side 30. The optical surface 5 acts refractive as a lens.

Figure 26:
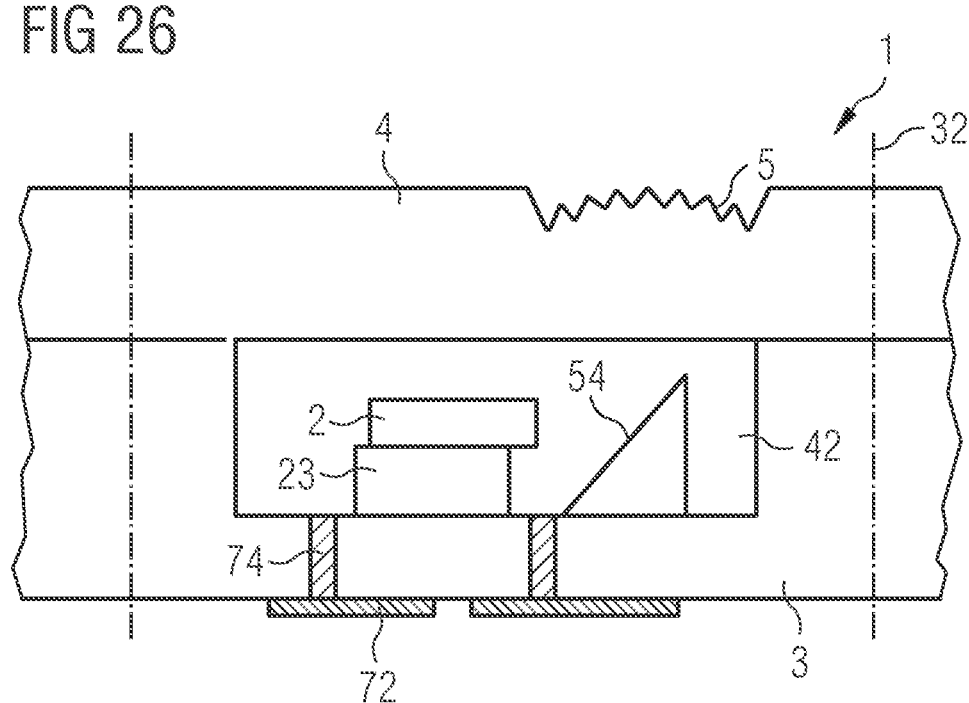

In the exemplary embodiment of FIG. 26, it is illustrated that the cavity 42 is not located in the encapsulation element 4, but in the mounting substrate 3. It is possible that a deflection optic 54 is mounted in the cavity 42, for example a prism. In order to compensate for positioning tolerances of the laser diode 2 as well as the deflection optics 54, the optical surface 5 is located on a side of the encapsulation element 4 facing away from the mounting substrate 3. As in all other exemplary embodiments, the optical surface 5 is preferably generated by a subtractive method, i.e. by removing material.

The optical surfaces 5 of FIGS. 25 and 26, which are refractive and non-reflective, can be produced analogously to FIGS. 1 to 24. In this case, however, the mirror layer 52 is preferably omitted. Instead of the mirror layer 52, anti-reflective coatings can be present in the area of the optical surface 5, not drawn.

Figure 27:
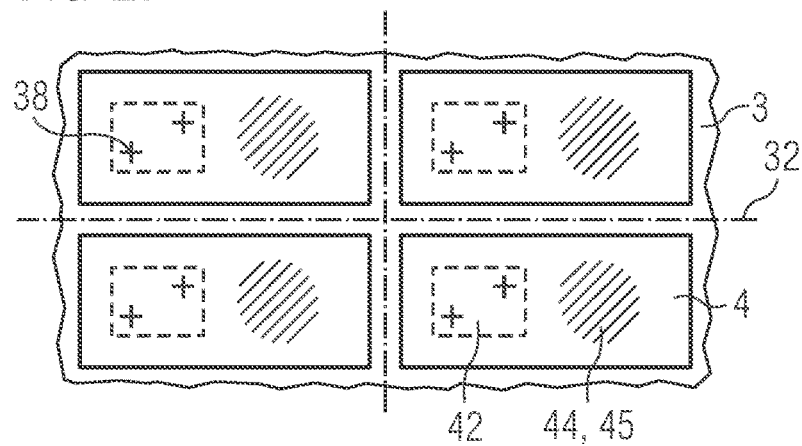
FIGS. 27 to 29 show schematic plan views of method steps of a method described herein.

In FIG. 27 it is illustrated in plan view that for each laser diode 2 a separate encapsulation element 4 is present. The encapsulation elements 4 are arranged in a grid pattern, and the separation lines 32 run between adjacent encapsulation elements 4. Areas for the subsequent optical surfaces are again indicated by a hatching.

Furthermore, it is shown that markings 38 may be present. The, for example, cross-shaped markings 38 may be located within the cavity 42. By means of such markings 38, a simplified placement of the laser diodes as well as the encapsulation elements 4 on the mounting substrate 3 can be achieved. Furthermore, such markings 38 may allow a simplified mounting of the finished semiconductor lasers 1 on an external carrier which is not shown.

Figure 28:
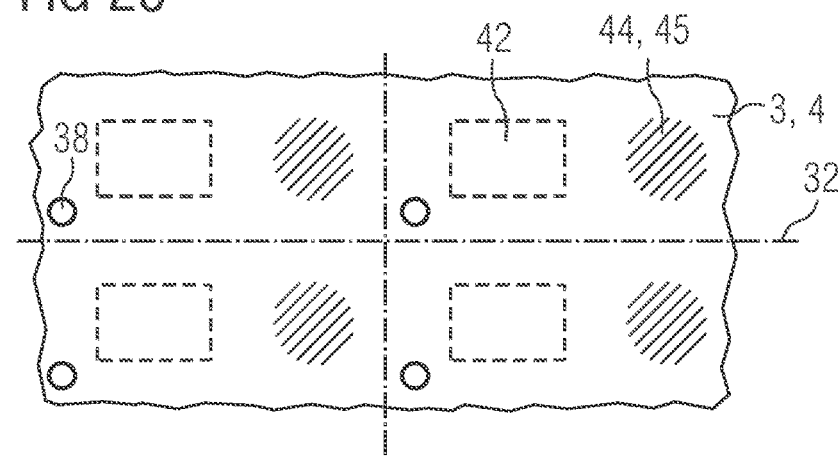

In contrast, it is shown in FIG. 28 that a one-piece continuous encapsulation element 4 is used. The separation lines 32 extend through the encapsulation element 4.

Optionally, there may be circular markings 38, for example, which may be located next to the cavity 32. Since the encapsulation element 4 is preferably translucent, the markings 38 may be covered by the encapsulation element 4.

Figure 29:
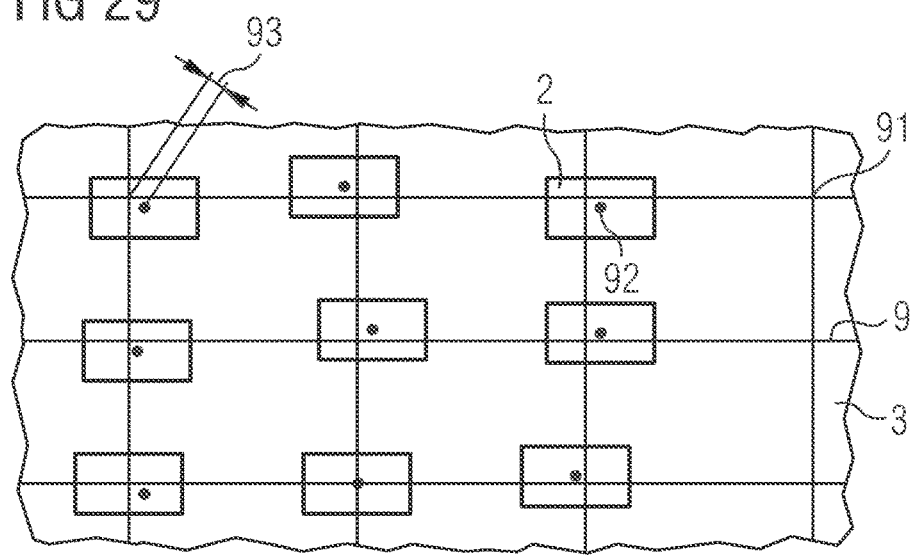

In FIG. 29, it is illustrated that the laser diodes 2 are placed in a grid 9. Laser diode centers 92 comprise comparatively large deviations from grid points 91 of grid 9. Thus, there is a comparatively large deviation 93 of the grid points 91 from the laser diode centers 92.

Over the entire mounting substrate 3, there is thus a comparatively large standard deviation with respect to the placement of the laser diode 2. Due to the subsequent, corrective optical surfaces 5, these comparatively large tolerances are possible during assembly, so that a cost-efficient placement of the laser diodes 2 can be carried out.

Unless otherwise indicated, the components shown in the figures preferably follow one another directly in the sequence indicated, for example. Layers not touching each other in the figures are preferably spaced apart. Insofar as lines are drawn parallel to each other, the corresponding surfaces are preferably also aligned parallel to each other. Likewise, unless otherwise indicated, the relative positions of the drawn components to each other are correctly reproduced in the figures.

The invention described herein is not limited by the description based on the exemplary embodiments. Rather, the invention encompasses any new feature as well as any combination of features, which in particular includes any combination of features in the patent claims, even if that feature or combination itself is not explicitly specified in the patent claims or exemplary embodiments.

The invention claimed is:

1. A method for producing semiconductor lasers comprising the following steps in the order given:
   A) attaching a plurality of edge-emitting laser diodes on a mounting substrate,
   B) attaching at least one encapsulation element such that the laser diodes are each attached in a cavity between the mounting substrate and the associated encapsulation element,
   C) operating the laser diodes and determining radiation directions of the laser diodes,
   D) producing material damage in partial areas of the at least one encapsulation element, wherein the partial areas are uniquely assigned to the laser diodes,
   E) collectively removing material of the at least one encapsulation element, wherein this material is affected by the material damages, so that individual optical surfaces for beam shaping are created for the laser diodes in the partial areas, and
   F) singulating to form individual semiconductor lasers.

2. The method according to claim 1,
   in which the optical surfaces are configured for deflecting the radiation directions from parallel to perpendicular to the mounting substrate,
   wherein said at least one encapsulating element is of a glass, of quartz glass or of sapphire, and
   wherein the at least one encapsulation element completely covers the associated laser diode in each case, and the optical surfaces, as seen in plan view of the mounting substrate, are located in each case next to the associated laser diode.

3. The method according to claim 1,
   in which the material damage is produced in step D) by means of pulsed laser radiation,
   wherein the collective removal in step E) is a wet chemical etching, and
   wherein the optical surfaces comprise at least one curvature.

4. The method according to claim 3,
   wherein the pulsed laser radiation in step D) is irradiated through an opening in the mounting substrate into the material of the at least one encapsulation element.

5. The method according to claim 1,
   in which a mirror layer is applied to the optical surfaces between steps E) and F) in a step E1), so that the optical surfaces act reflectively,
   wherein the mirror layer is generated in a structured manner with the aid of a temporary mask layer.

6. The method according to claim 1,
   wherein the optical surfaces are refractive and are generated in steps D) and E) on an outer surface of an outer wall of the associated cavity.

7. The method according to claim 1,
   in which, at least in step C), a recess is located on an outer surface of an outer wall of each of the cavities in the at least one encapsulation element,
   wherein in step C) a test mirror is guided into the recess to determine the respective radiation direction, and
   wherein the recess is located between the outer surface and an associated optical surface of the individual optical surfaces.

8. The method according to claim 1,
   in which the at least one encapsulation element comprises, at least in step C), a plurality of reflection regions which are configured for deflecting the respective radiation direction from parallel to perpendicular to the mounting substrate,
   wherein in step C) the determination of the respective radiation direction is carried out by means of the reflection regions,
   wherein an associated optical surface of the individual optical surfaces is generated in steps D) and E) between the respective reflection region and the respective laser diode.

9. The method according to claim 8,
   in which, in step C), a distance between the reflection regions and the respective associated laser diode is at least 1 mm, wherein the reflection regions are formed by specularly reflecting outer boundary surfaces of the at least one encapsulation element or by diffusely reflecting scattering centers located within the at least one encapsulation element.

10. The method according to claim 8, wherein the reflection regions are removed in step F).

11. The method according to claim 1, in which the laser diodes are each encapsulated with a potting material in a step A1) between steps A) and B), so that in step B) the cavities are filled by the potting material, wherein the potting is removed again at the latest after step F).

12. The method according to claim 11,
wherein in step B) the at least one encapsulation element is fixed to the mounting substrate by the potting,
wherein the potting is completely removed before step F), so that at least in places a gap is formed between the at least one encapsulation element and the mounting substrate.

13. The method according to claim 1, in which a metallic via extends through the at least one encapsulation element and at least as far as the mounting substrate, which via, as seen in plan view, completely surrounds the associated laser diode together with the optical surface, so that the via forms a metal frame which effects a seal between the mounting substrate and the at least one encapsulation element.

14. The method according to claim 1, in which a respective continuous frame is formed by the at least one encapsulation element around the laser diodes and around the respective associated optical surface, as seen in plan view, which frame comprises a height which is greater than a maximum height of the at least one encapsulation element in the region of the corresponding optical surface.

15. The method according to claim 1,
in which exactly one encapsulation element is used,
wherein the encapsulation element extends continuously over all laser diodes until step F).

16. The method according to claim 1,
in which the laser diodes are applied to the mounting substrate in a regular grid in step A),
wherein a standard deviation between an actual position of the laser diodes to grid points of the grid across the mounting substrate is between 5 μm and 100 μm inclusive.

17. A semiconductor laser produced with the method according to claim 1, comprising:
the mounting substrate,
at least one of the laser diodes mounted on the mounting substrate, and
the encapsulation element transparent to a laser emission of the laser diode, such that the laser diode is mounted in the cavity between the mounting substrate and the encapsulation element,
wherein
the encapsulation element comprises one of the optical surfaces for beam shaping of the laser emission (L) from the associated laser diode,
the optical surface is configured for deflecting the laser emission (L) from parallel to perpendicular to the mounting substrate, and
a recess is located in the encapsulation element between an outer wall of the cavity and the optical surface along the radiation direction of the laser emission (L), so that the laser emission (L) has to pass through both the outer wall and the recess towards the optical surface.

* * * * *